(12) United States Patent
Shinjo et al.

(10) Patent No.: US 8,822,138 B2
(45) Date of Patent: Sep. 2, 2014

(54) COMPOSITION FOR FORMING RESIST UNDERLAYER FILM FOR LITHOGRAPHY INCLUDING RESIN CONTAINING ALICYCLIC RING AND AROMATIC RING

(75) Inventors: Tetsuya Shinjo, Toyama (JP); Hirokazu Nishimaki, Toyama (JP); Yasushi Sakaida, Toyama (JP); Keisuke Hashimoto, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 441 days.

(21) Appl. No.: 13/389,682

(22) PCT Filed: Aug. 11, 2010

(86) PCT No.: PCT/JP2010/063631
§ 371 (c)(1),
(2), (4) Date: Feb. 9, 2012

(87) PCT Pub. No.: WO2011/021555
PCT Pub. Date: Feb. 24, 2011

(65) Prior Publication Data
US 2012/0142195 A1    Jun. 7, 2012

(30) Foreign Application Priority Data
Aug. 19, 2009   (JP) .................................. 2009-189700

(51) Int. Cl.
| | | |
|---|---|---|
| *G03F 7/11* | (2006.01) | |
| *H01L 21/027* | (2006.01) | |
| *C08G 65/332* | (2006.01) | |
| *G03F 7/09* | (2006.01) | |
| *G03F 7/075* | (2006.01) | |

(52) U.S. Cl.
CPC .............. *G03F 7/091* (2013.01); *G03F 7/0752* (2013.01); *G03F 7/094* (2013.01)
USPC ................... 430/314; 430/271.11; 430/272.1; 430/316; 430/317; 430/318; 430/323; 216/47; 525/408; 525/533; 438/706; 438/781

(58) Field of Classification Search
None
See application file for complete search history.

(56) References Cited

U.S. PATENT DOCUMENTS

| | | |
|---|---|---|
| 2004/0241577 A1 | 12/2004 | Hatakeyama et al. |
| 2007/0190459 A1 | 8/2007 | Hashimoto et al. |
| 2009/0053647 A1 | 2/2009 | Enomoto et al. |
| 2010/0022090 A1 | 1/2010 | Sakaguchi et al. |

FOREIGN PATENT DOCUMENTS

| | | |
|---|---|---|
| JP | A-2004-354554 | 12/2004 |
| JP | A-2007-241259 | 9/2007 |
| JP | A-2008-096684 | 4/2008 |
| WO | WO 2006/132088 A1 | 12/2006 |
| WO | WO 2008/069047 A1 | 6/2008 |

OTHER PUBLICATIONS

Maeda et al (ArF Chemically Amplified Negative Resist Using Alicyclic Epoxy POlymer, Journal of Photopolymer Science and Technology, vol. 11, No. 3, (1998) pateds 507-512.*
Sep. 7, 2010 Written Opinion issued in International Patent Application No. PCT/JP2010/063631.
Sep. 7, 2010 International Search Report issued in International Patent Application No. PCT/JP2010/063631 (with translation).

* cited by examiner

*Primary Examiner* — Cynthia Hamilton
(74) *Attorney, Agent, or Firm* — Oliff PLC

(57) ABSTRACT

There is provided a resist underlayer film having both heat resistance and etching selectivity. A composition for forming a resist underlayer film for lithography, comprising a reaction product (C) of an alicyclic epoxy polymer (A) with a condensed-ring aromatic carboxylic acid and monocyclic aromatic carboxylic acid (B). The alicyclic epoxy polymer (A) may include a repeating structural unit of Formula (1):

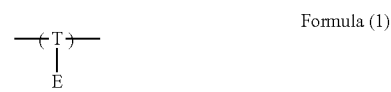

Formula (1)

(T is a repeating unit structure containing an alicyclic ring in the polymer main chain; and E is an epoxy group or an organic group containing an epoxy group). The condensed-ring aromatic carboxylic acid and monocyclic aromatic carboxylic acid (B) may include a condensed-ring aromatic carboxylic acid (B1) and a monocyclic aromatic carboxylic acid (B2) in a molar ratio of B1:B2=3:7 to 7:3. The condensed-ring aromatic carboxylic acid (B1) may be 9-anthracenecarboxylic acid and the monocyclic aromatic carboxylic acid (B2) may be benzoic acid.

13 Claims, No Drawings

COMPOSITION FOR FORMING RESIST UNDERLAYER FILM FOR LITHOGRAPHY INCLUDING RESIN CONTAINING ALICYCLIC RING AND AROMATIC RING

TECHNICAL FIELD

The present invention relates to a composition for forming a resist underlayer film for lithography (hereinafter, also expressed as a composition for forming a resist underlayer film) that is useful in semiconductor substrate processing, a process for forming a resist pattern using a resist underlayer film for lithography (hereinafter, also expressed as a resist underlayer film) formed from the composition, and a process for producing a semiconductor device.

BACKGROUND ART

Conventionally in production of semiconductor devices, microfabrication is performed by lithography using a photoresist composition. The microfabrication is a processing method of forming a thin film of the photoresist composition on a substrate being processed such as a silicon wafer, irradiating the workpiece with an active ray such as ultraviolet light through a mask pattern having a pattern for a semiconductor device, and developing the workpiece, followed by etching the substrate being processed such as a silicon wafer using the obtained photoresist pattern as a protective layer. However, in recent years, the degrees of integration of semiconductor devices are progressively enhanced and active rays having shorter wavelengths are increasingly used accompanied with replacement of a KrF excimer laser (248 nm) by an ArF excimer laser (193 nm). Along with this trend, influences of an active ray that is diffuse reflected from a substrate and of a standing wave are becoming serious problems. Hence, studies have been widely conducted on a method of providing an anti-reflective coating (Bottom Anti-Reflective Coating, BARC) between a photoresist and a substrate being processed.

By the way, as the trend toward finer resist patterns progresses, a resolution problem and a problem that resist patterns collapse after development will occur, and thinner-film resists will be desired. Because of this tendency, it becomes difficult to obtain a resist pattern having a film thickness that is adequate for substrate processing, and a demand is growing for a process to provide not only a resist pattern but also a resist underlayer film formed between a resist and a semiconductor substrate being processed with a function to serve as a mask on substrate processing. As the resist underlayer film for such a process, resist underlayer films for lithography having dry etching selectivity similar to that of a resist, resist underlayer films for lithography having dry etching selectivity smaller than that of a resist, and resist underlayer films for lithography having dry etching selectivity smaller than that of a semiconductor substrate are being required instead of conventional resist underlayer films having high etch rate properties (having high etching rates).

In order to satisfy these requirements, it is disclosed to subject an aliphatic epoxy polymer to a reaction with anthracenecarboxylic acid and use the obtained polymer as an anti-reflective coating for a resist underlayer (see Patent Document 1).

RELATED ART DOCUMENT

Patent Document

Patent Document 1: International Publication No, WO 2006/132088 pamphlet

DISCLOSURE OF THE INVENTION

Problem to be Solved by the Invention

The present invention provides a composition for forming a resist underlayer film to be used in a lithography process for producing a semiconductor device. The present invention also provides a resist underlayer film for lithography having dry etching selectivity similar to that of a resist, a resist underlayer film for lithography having dry etching selectivity smaller than that of a resist, and a resist underlayer film for lithography having dry etching selectivity smaller than that of a semiconductor substrate, either of which causes no intermixing with a resist layer and can provide an excellent resist pattern. The present invention also provides a process for forming a resist pattern using a resist underlayer film for lithography formed from the composition for forming a resist underlayer film for lithography. The present invention also provides a composition for forming a resist underlayer film for lithography that is used for forming a resist underlayer film that further has heat resistance.

Means for Solving the Problem

The present invention provides:

as a first aspect, a composition for forming a resist underlayer film for lithography, including a reaction product (C) of an alicyclic epoxy polymer (A) with a condensed-ring aromatic carboxylic acid and monocyclic aromatic carboxylic acid (B);

as a second aspect, the composition for forming a resist underlayer film for lithography according to the first aspect, in which the alicyclic epoxy polymer (A) includes a repeating structural unit of Formula (1):

Formula (1)

(T is a repeating unit structure containing an alicyclic ring in the polymer main chain; and B is an epoxy group or an organic group containing an epoxy group);

as a third aspect, the composition for forming a resist underlayer film for lithography according to the first aspect or the second aspect, in which the condensed-ring aromatic carboxylic acid and monocyclic aromatic carboxylic acid (B) include a condensed-ring aromatic carboxylic acid (B1) and a monocyclic aromatic carboxylic acid (B2) in a molar ratio of B1:B2=3:7 to 7:3;

as a fourth aspect, the composition for forming a resist underlayer film for lithography according to the third aspect, in which the condensed-ring aromatic carboxylic acid (B1) is 9-anthracenecarboxylic acid and the monocyclic aromatic carboxylic acid (B2) is benzoic acid;

as a fifth aspect, the composition for forming a resist underlayer film for lithography according to any one of the first aspect to the fourth aspect, in which the reaction product (C) is a polymer including a repeating structural unit of Formula (2):

Formula (2)

(T is a repeating unit structure containing an alicyclic ring in the polymer main chain; Q is an organic group linking T and Ar; and Ar is an aromatic condensed ring or an aromatic monocyclic ring);

as a sixth aspect, the composition for forming a resist underlayer film for lithography according to any one of the first aspect to the fifth aspect, in which the reaction product (C) is a polymer in which the number of a repeating structural unit a of Formula (3), the number of a repeating structural unit b of Formula (4), and the number of a repeating structural unit c of Formula (5):

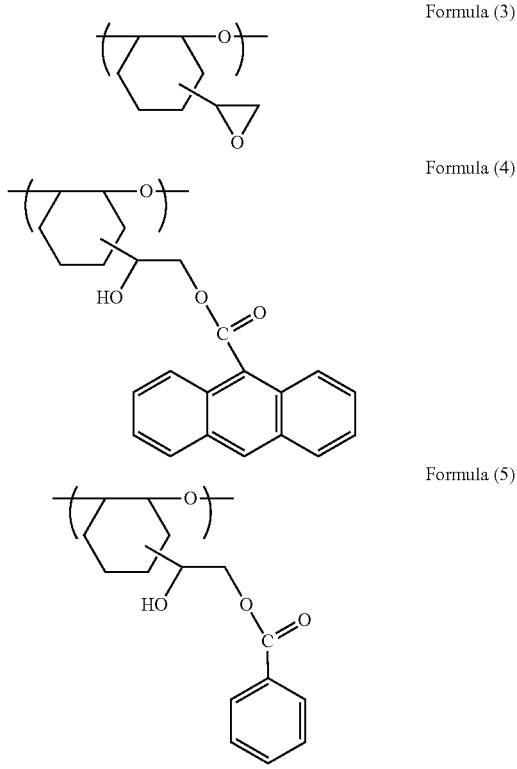

Formula (3)

Formula (4)

Formula (5)

satisfy $0 \leq a \leq 0.2$, $0.3 \leq b \leq 0.7$, $0.3 \leq c \leq 0.7$, and $0.5 \leq b+c \leq 1.0$ provided that the total number of the repeating structural units in the reaction product (C) is 1.0;

as a seventh aspect, the composition for forming a resist underlayer film for lithography according to the sixth aspect, in which the reaction product (C) is a polymer in which the number of the repeating structural unit a of Formula (3), the number of the repeating structural unit b of Formula (4), and the number of the repeating structural unit c of Formula (5) satisfy the conditions that a is 0, b is 0.45, and c is 0.55 provided that the total number of the repeating structural units in the reaction product (C) is 1.0;

as an eighth aspect, the composition for forming a resist underlayer film for lithography according to any one of the first aspect to the seventh aspect, further including a crosslinking agent;

as a ninth aspect, the composition for forming a resist underlayer film for lithography according to any one of the first aspect to the eighth aspect, further including an acid or an acid generator;

as a tenth aspect, a resist underlayer film for lithography obtained by coating a semiconductor substrate with the composition for forming a resist underlayer film for lithography as described in any one of the first aspect to the ninth aspect and baking the resulting product;

as an eleventh aspect, a process for forming a resist pattern used for semiconductor production, including coating a semiconductor substrate with the composition for forming a resist underlayer film for lithography as described in any one of the first aspect to the ninth aspect and baking the resultant product to form a resist underlayer film for lithography;

as a twelfth aspect, a process for producing a semiconductor device, including forming a resist underlayer film for lithography using the composition for forming a resist underlayer film for lithography as described in any one of the first aspect to the ninth aspect on a semiconductor substrate, forming a resist film on the resist underlayer film, forming a resist pattern by light or electron beam irradiation and development, etching the resist underlayer film for lithography using the resist pattern, and processing the semiconductor substrate using the patterned resist underlayer film for lithography; and as a thirteenth aspect, a process for producing a semiconductor device, including forming a resist underlayer film for lithography using the composition for forming a resist underlayer film for lithography as described in any one of the first aspect to the ninth aspect on a semiconductor substrate, forming a hard mask on the resist underlayer film, forming a resist film on the hard mask, forming a resist pattern by light or electron beam irradiation and development, etching the hard mask using the resist pattern, etching the resist underlayer film for lithography using the patterned hard mask, and processing the semiconductor substrate using the patterned resist underlayer film for lithography.

Effects of the Invention

Using the composition for forming a resist underlayer film for lithography of the present invention, excellent resist pattern profiles can be formed with no intermixing with layers over the resist underlayer film.

The resist underlayer film formed from the composition for forming a resist underlayer film for lithography of the present invention can be provided with an ability to effectively inhibit reflection from the substrate in the case where irradiation light having a wavelength of 248 nm, 193 nm, 157 nm, or the like is used for microfabrication, which means the resist underlayer film can be provided with efficacy as an antireflective coating for exposure light.

Using the composition for forming a resist underlayer film for lithography of the present invention, an excellent resist underlayer film having dry etching selectivity similar to that of a resist, dry etching selectivity smaller than that of a resist, and dry etching selectivity smaller than that of a semiconductor substrate can be provided.

To prevent resist patterns from collapsing after development as a result of using finer resist patterns, thinner-film resists have been produced. Such thin-film resists undergo a process in which a resist pattern is transferred to the underlayer film thereof by an etching process, followed by substrate processing using the underlayer film as a mask, or a process in which a resist pattern is transferred to the underlayer film thereof by an etching process, followed by further transferring the pattern that has been transferred to the underlayer film to an underlayer film that is under the underlayer film using a different gas composition, and these are repeated to eventually perform substrate processing. The composition for forming a resist underlayer film for lithography of the present invention and the resist underlayer film formed from the composition are useful in these processes and, on substrate processing using the resist underlayer film of the present invention, adequate etch resistance is provided in comparison with the substrate being processed (a thermal silicon oxide film, a silicon nitride film, or a polysilicon film on the substrate, for example).

The resist underlayer film for lithography of the present invention can be used as a planarization film, a film for preventing a resist layer from contamination, or a film with dry etch selectivity. Thus, resist pattern formation in a lithography process in semiconductor production can be easily and accurately performed.

There is a process in which the resist underlayer film for lithography is formed on the substrate using the composition for forming a resist underlayer film for lithography of the present invention, the hard mask is formed thereon, the resist film is formed on the hard mask, the resist pattern is formed by exposure and development, the resist pattern is transferred to the hard mask, the resist pattern that has been transferred to the hard mask is transferred to the resist underlayer film for lithography, and semiconductor substrate processing is performed using the resist underlayer film for lithography. In this process, the hard mask is formed using a coating composition containing an organic polymer or an inorganic polymer and a solvent, or by vacuum deposition of an inorganic substance. In the case of vacuum deposition of an inorganic substance (silicon oxynitride, for example), the evaporation product is deposited on the surface of the resist underlayer film and, at this time, the surface temperature of the resist underlayer film increases to around 400° C. The resist underlayer film for lithography of the present invention can be efficiently used as the resist underlayer film to be used in this process.

MODES FOR CARRYING OUT THE INVENTION

The composition for forming a resist underlayer film for lithography of the present invention includes a reaction product (C) of an alicyclic epoxy polymer (A) with a condensed-ring aromatic carboxylic acid and monocyclic aromatic carboxylic acid (B), and further includes a solvent. The composition for forming a resist underlayer film for lithography of the present invention can include a crosslinking agent, an acid, and, where appropriate, an additive such as acid generators and surfactants.

The composition for forming a resist underlayer film for lithography has a solid content proportion of 0.1 to 70% by mass or 0.1 to 60% by mass. The solid content herein is what is left after removing the solvent from the total components of the composition for forming a resist underlayer film for lithography.

The composition for forming a resist underlayer film for lithography of the present invention will be described in detail.

The alicyclic epoxy polymer (A) used in the present invention has a repeating structural unit of Formula (1).

Formula (1)

(T is a repeating unit structure containing an alicyclic ring in the polymer main chain; and E is an epoxy group or an organic group containing an epoxy group).

E is a substituent of the alicyclic ring, and the epoxy group may be directly bonded to an aliphatic group or the organic group (a glycidyl group, for example) containing an epoxy group may be bonded to the aliphatic group.

The alicyclic ring is, for example, of 4 to 10 carbon atoms that are linked to make a ring and is particularly of 6 carbon atoms that are linked to make a ring. The alicyclic ring can contain another substituent besides the substituent E (the epoxy group or the organic group containing an epoxy group). Examples of the substituent include $C_{1-10}$ alkyl groups, $C_{6-20}$ aryl groups, halogen atoms, a nitro group, an amino group, and the like.

Examples of the $C_{1-10}$ alkyl groups include a methyl group, an ethyl group, an n-propyl group, an isopropyl group, a cyclopropyl group, an n-butyl group, an isobutyl group, a sec-butyl group, a tert-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-isopropyl-cyclopropyl group, a 2-isopropyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, a 2-ethyl-3-methyl-cyclopropyl group, and the like.

Examples of the $C_{6-20}$ aryl groups include a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

Examples of the halogen atoms include a fluorine atom, a chlorine atom, a bromine atom, and an iodine atom.

The alicyclic epoxy polymer (A) of Formula (1) has a weight average molecular weight of 600 to 1000000 and preferably 1000 to 200000. The weight average molecular weight is obtained by gel permeation chromatography (GPC) using polystyrene as a standard sample. The number of the repeating units in the alicyclic epoxy polymer (A) of Formula (1) is 2 to 3000 or 3 to 600.

Examples of the alicyclic epoxy compound as a raw material for producing the alicyclic epoxy polymer (A) include 1,2-epoxy-4-(2-oxiranyl)cyclohexane, 3,4-epoxycyclohexenylmethyl-3',4'-epoxycyclohexene carboxylate, 3,4-epoxycyclohexenylmethyl-3',4'-epoxycyclohexene carboxylate (manufactured by DAICEL CHEMICAL INDUSTRIES, LTD., trade name: CELLOXIDE 2021P), 1,2:8,9 diepoxylimonene (manufactured by DAICEL CHEMICAL INDUSTRIES, LTD., trade name: CELLOXIDE 3000), and the like. The alicyclic epoxy polymer (A) used in the present invention is obtained by polymerizing these raw material compounds.

Examples of the alicyclic epoxy polymer (A) include an adduct of 2,2-bis(hydroxymethyl)-1-butanol with 1,2-epoxy-4-(2-oxiranyl)cyclohexane (manufactured by DAICEL CHEMICAL INDUSTRIES, LTD., trade name: EHPE3150), and a mixture of an adduct of 2,2-bis(hydroxymethyl)-1-butanol with 1,2-epoxy-4-(2-oxiranyl)cyclohexane and 3,4-epoxycyclohexenylmethyl-3',4'-epoxycyclohexene carboxylate (manufactured by DAICEL CHEMICAL INDUSTRIES, LTD., trade name: EHPE3150CE).

For example, the following polymers are exemplified.

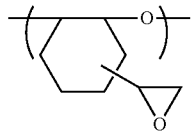

Formula (1-1)

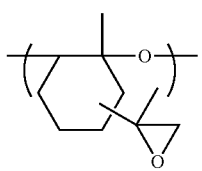

Formula (1-2)

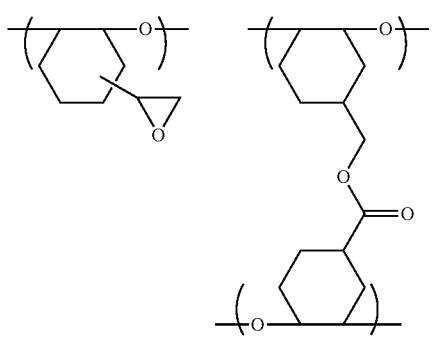

Formula (1-3)

The condensed-ring aromatic carboxylic acid and monocyclic aromatic carboxylic acid (B) used in the present invention are a condensed-ring aromatic carboxylic acid (B1) and a monocyclic aromatic carboxylic acid (B2), and are preferably carboxylic acids containing benzene or a ring including a condensed benzene ring. The condensed-ring aromatic carboxylic acid (B1) is, for example, carboxylic acids having a polycyclic structure formed by condensation of benzene rings. Examples thereof include naphthalenecarboxylic acid and anthracenecarboxylic acid, and particularly preferable is 9-anthracenecarboxylic acid. As the monocyclic aromatic carboxylic acid (B2), benzoic acid is preferably used.

The condensed-ring aromatic carboxylic acid and monocyclic aromatic carboxylic acid (B) including the condensed-ring aromatic carboxylic acid (B1) and the monocyclic aromatic carboxylic acid (B2) in a molar ratio of B1:B2=3:7 to 7:3 and preferably in a molar ratio of B1:B2=4:6 to 6:4 can be used.

The reaction product (C) used in the present invention is obtained by a reaction of the alicyclic epoxy polymer (A) with the condensed-ring aromatic carboxylic acid and monocyclic aromatic carboxylic acid (B), and the reaction product (C) is a resin (polymer).

The polymer can be included in the solid content at a proportion of 1 to 100% by mass, 1 to 99% by mass, or 50 to 99% by mass.

The polymer used in the present invention has a weight average molecular weight of 600 to 1000000 and preferably 1000 to 200000. The weight average molecular weight is obtained by gel permeation chromatography (GPC) using polystyrene as a standard sample. The number of the repeating units in the reaction product (C) is 2 to 3000 or 3 to 600.

The reaction product (C) is a polymer having a repeating structural unit of Formula (2).

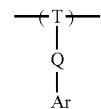

Formula (2)

(T is a repeating unit structure containing an alicyclic ring in the polymer main chain; Q is an organic group linking T and Ar; and Ar is an aromatic condensed ring or an aromatic monocyclic ring).

Q is a divalent linking group, the aromatic condensed ring is, for example, a naphthalene ring or an anthracene ring, and the aromatic monocyclic ring is, for example, a benzene ring. The organic group is an organic group resulting from a reaction of the epoxy group with the carboxylic acid. The organic group contains a hydroxy group, which can form a crosslinking bond between each other or together with the crosslinking agent.

For example, the reaction product (C) is preferably a polymer in which the number of a repeating structural unit a of Formula (3), the number of a repeating structural unit b of Formula (4), and the number of a repeating structural unit c of Formula (5):

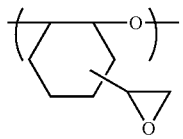

Formula (3)

Formula (4)

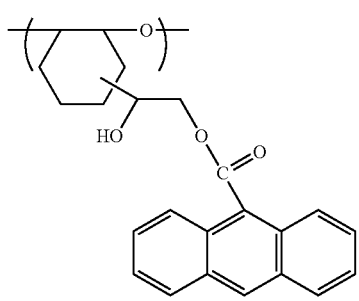

Formula (5)

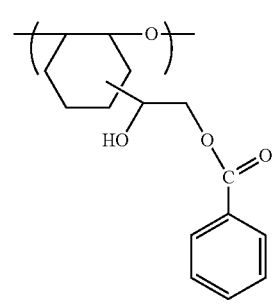

satisfy $0 \leq a \leq 0.2$, $0.3 \leq b \leq 0.7$, $0.3 \leq c \leq 0.7$, and $0.5 \leq b+c \leq 1.0$ provided that the total number of the repeating structural units in the reaction product (C) is 1.0.

As the reaction product (C), a polymer in which the number of the repeating structural unit a of Formula (3), the number of the repeating structural unit b of Formula (4), and the number of the repeating structural unit c of Formula (5) satisfy the conditions that a is 0, b is 0.45, and c is 0.55 provided that the total number of the repeating structural units in the reaction product (C) is 1.0 can be used.

The polymer as the reaction product (C) is exemplified as follows.

Formula (2-1)

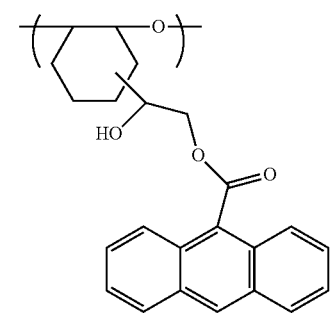

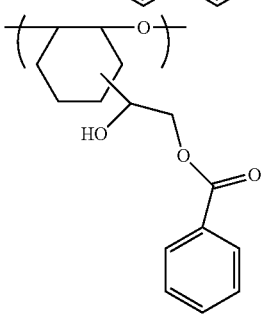

Formula (2-2)

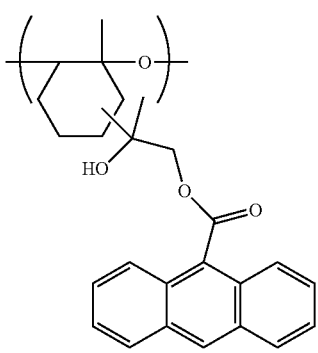

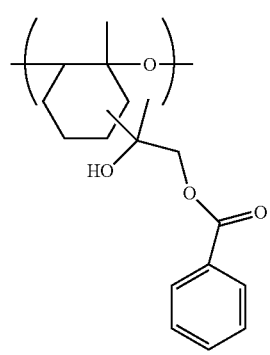

Formula (2-3)

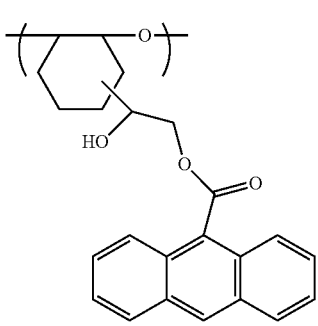

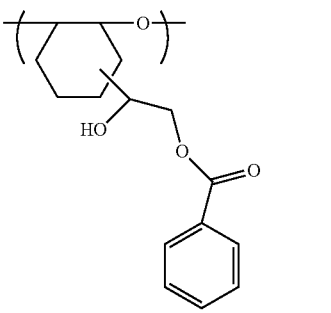

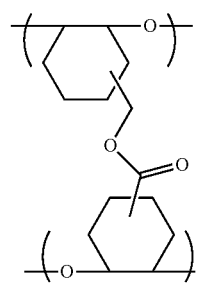

-continued
Formula (2-4)
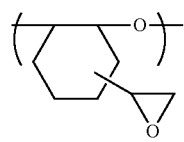 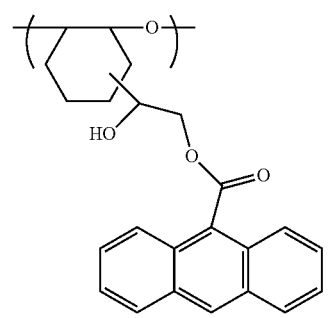
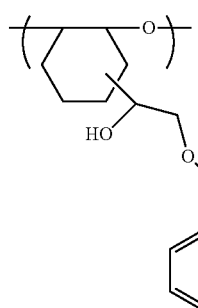
Formula (2-5)
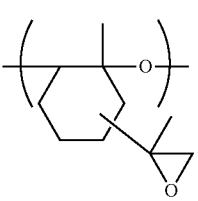 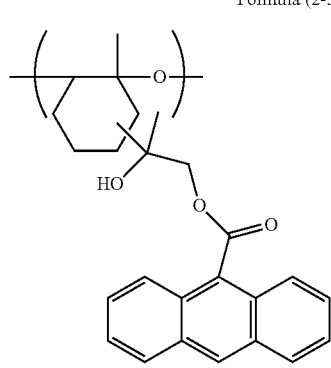
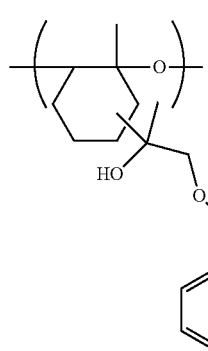
Formula (2-6)
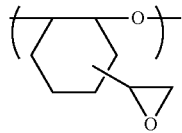 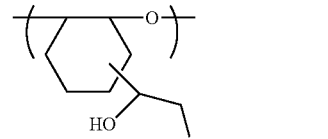
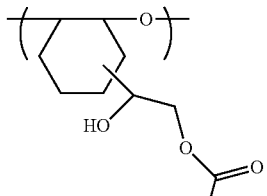
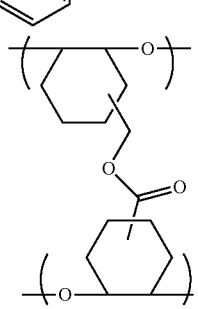
Formula (2-7)
Formula (2-8)
Formula (2-9)

-continued

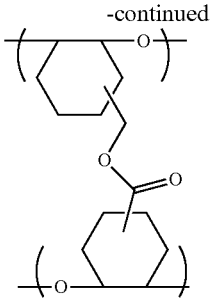

Formula (2-10)

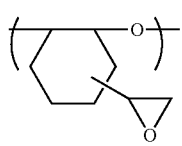 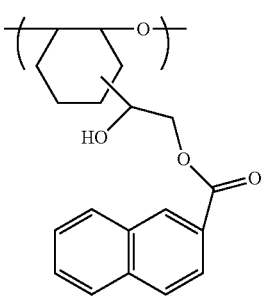

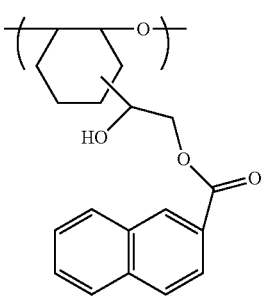

Formula (2-11)

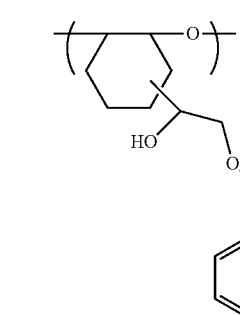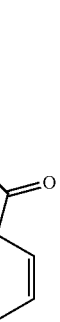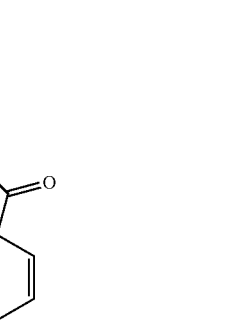

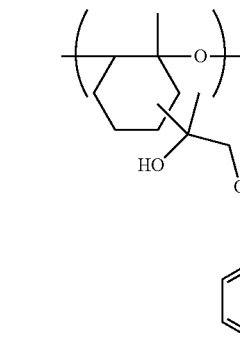

-continued

Formula (2-12)

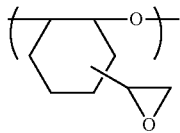 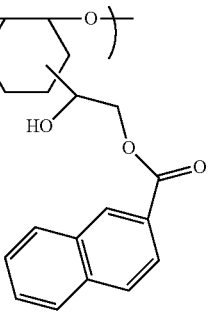

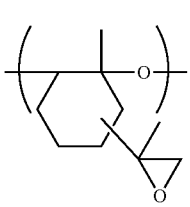 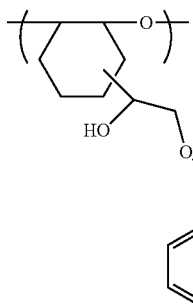

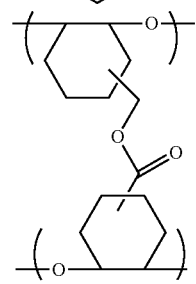

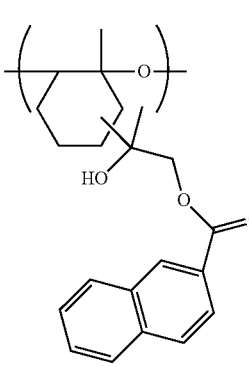

The polymer can be used as a mixture with other polymers that occupy not higher than 30% by mass of the total polymers.

Examples of the other polymers include polyacrylic acid ester compounds, polymethacrylic acid ester compounds, polyacrylamide compounds, polymethacrylamide compounds, polyvinyl compounds, polystyrene compounds, polymaleimide compounds, polymaleic acid anhydrides, and polyacrylonitrile compounds.

Examples of the monomer as a raw material for the polyacrylic acid ester compounds include methyl acrylate, ethyl acrylate, isopropyl acrylate, benzyl acrylate, naphthyl acrylate, anthryl acrylate, anthrylmethyl acrylate, phenyl acrylate, 2-hydroxyethyl acrylate, 2-hydroxypropyl acrylate, 2,2,2-trifluoroethyl acrylate, 4-hydroxybutyl acrylate, isobutyl acrylate, tert-butyl acrylate, cyclohexyl acrylate, isobornyl acrylate, 2-methoxyethyl acrylate, methoxytriethylene glycol acrylate, 2-ethoxyethyl acrylate, tetrahydrofurfuryl acrylate, 3-methoxybutyl acrylate, 2-methyl-2-adamantyl acrylate, 2-ethyl-2-adamantyl acrylate, 2-propyl-2-adamantyl acrylate, 2-methoxybutyl-2-adamantyl acrylate, 8-methyl-8-tricyclodecyl acrylate, 8-ethyl-8-tricyclodecyl acrylate, 5-acryloyloxy-6-hydroxynorbornene-2-carboxylic-6-lactone, and the like.

Examples of the monomer as a raw material for the polymethacrylic acid ester compounds include ethyl methacrylate, n-propyl methacrylate, n-pentyl methacrylate, cyclohexyl methacrylate, benzyl methacrylate, naphthyl methacrylate, anthryl methacrylate, anthrylmethyl methacrylate, phenyl methacrylate, 2-phenylethyl methacrylate, 2-hydroxyethyl methacrylate, 2-hydroxypropyl methacrylate, 2,2,2-trifluoroethyl methacrylate, 2,2,2-trichloroethyl methacrylate, methyl acrylate, isobutyl methacrylate, 2-ethylhexyl methacrylate, isodecyl methacrylate, n-lauryl methacrylate, n-stearyl methacrylate, methoxydiethylene glycol methacrylate, methoxypolyethylene glycol methacrylate, tetrahydrofurfuryl methacrylate, isobornyl methacrylate, tert-butyl methacrylate, isostearyl methacrylate, n-butoxyethyl methacrylate, 3-chloro-2-hydroxypropyl methacrylate, 2-methyl-2-adamantyl methacrylate, 2-ethyl-2-adamantyl methacrylate, 2-propyl-2-adamantyl methacrylate, 2-methoxybutyl-2-adamantyl methacrylate, 8-methyl-8-tricyclodecyl methacrylate, 8-ethyl-8-tricyclodecyl methacrylate, 5-methacryloyloxy-6-hydroxynorbornene-2-carboxylic-6-lactone, 2,2,3,3,4,4,4-heptafluorobutyl methacrylate, and the like.

Examples of the monomer as a raw material for the polyacrylamide compounds include acrylamide, N-methylacrylamide, N-ethylacrylamide, N-benzylacrylamide, N-phenylacrylamide, N,N-dimethylacrylamide, and the like.

Examples of the monomer as a raw material for the polymethacrylamide compounds include methacrylamide, N-methylmethacrylamide, N-ethylmethacrylamide, N-benzylmethacrylamide, N-phenylmethacrylamide, N,N-dimethylmethacrylamide, and the like.

Examples of the monomer as a raw material for the polyvinyl compounds include vinyl ether, methyl vinyl ether, benzyl vinyl ether, 2-hydroxyethyl vinyl ether, phenyl vinyl ether, propyl vinyl ether, and the like.

Examples of the monomer as a raw material for the polystyrene compounds include styrene, methylstyrene, chlorostyrene, bromostyrene, hydroxystyrene, and the like.

Examples of the monomer as a raw material for the polymaleimide compounds include maleimide, N-methylmaleimide, N-phenylmaleimide, N-cyclohexylmaleimide, and the like.

The composition for forming a resist underlayer film for lithography of the present invention can include a crosslinking agent component. Examples of the crosslinking agent include melamine-based crosslinking agents, substituted urea-based crosslinking agents, crosslinking agents based on a polymer of these melamine and substituted urea, and the like. Preferable are crosslinking agents containing at least 2 crosslink-forming substituents, and are compounds such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea. Condensates of these compounds can also be used.

The addition amount of the crosslinking agent varies depending on a coating solvent to be used, a base substrate to be used, desired solution viscosity, a desired film shape, and the like, and is 0.001 to 80% by mass, is preferably 0.01 to 50% by mass, and is further preferably 0.05 to 40% by mass, relative to the total solid contents in the composition for forming a resist underlayer film for lithography of the present invention. The crosslinking agent may cause a crosslinking reaction by self-condensation, while, in the case where the polymer of the present invention contains a crosslinking substituent (a hydroxy group, for example), the crosslinking agent can cause a crosslinking reaction with the crosslinking substituent.

In the present invention, as a catalyst for facilitating the crosslinking reaction, acidic compounds such as p-toluenesulfonic acid, trifluoromethanesulfonic acid, pyridinium p-toluenesulfonate, salicylic acid, sulfosalicylic acid, citric acid, benzoic acid, hydroxybenzoic acid, and naphthalenecarboxylic acid, and/or thermal acid generators such as 2,4,4,6-tetrabromocyclohexadienone, benzoin tosylate, 2-nitrobenzyl tosylate, and other organic sulfonic acid alkyl esters can be formulated. The formulation amount thereof is 0.0001 to 20% by mass, is preferably 0.0005 to 10% by mass, and is preferably 0.01 to 4% by mass, relative to the total solid contents in the composition for forming a resist underlayer film for lithography of the present invention.

In order to make the acidity of the composition for forming a resist underlayer film for lithography of the present invention coincide with that of a photoresist to be applied over the composition in a lithography process, a photoacid generator can be added to the composition. Examples of the preferable photoacid generator include onium salt photoacid generators such as bis(4-tert-butylphenyl)iodonium trifluoromethanesulfonate and triphenylsulfonium trifluoromethanesulfonate, photoacid generators based on a halogen-containing compound such as phenyl-bis(trichloromethyl)-sec-triazine, sulfonic acid photoacid generators such as benzoin tosylate and N-hydroxysuccinimide trifluoromethanesulfonate, and the like. The photoacid generator is 0.2 to 10% by mass and is preferably 0.4 to 5% by mass relative to the total solid contents in the composition for forming a resist underlayer film for lithography of the present invention.

Other than these, light absorbers, rheology modifiers, adhesive aids, surfactants, and the like can be added, where appropriate, to the composition for forming a resist underlayer film for lithography of the present invention.

As the light absorber to be added, for example, commercially available light absorbers described in "*Kogyo-you Shikiso no Gijutsu to Shijo* (Techniques and Markets for Industrial Pigments)" (CMC Publishing CO., LTD.) and "*Senryo Binran* (Handbook of Dye)" (edited by The Society of Synthetic Organic Chemistry, Japan), such as C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; C. I. Pigment Brown 2; and the like can be suitably used. The light absorber is usually formulated in a proportion of not higher than 10% by mass and preferably not higher than 5% by mass relative to the total solid contents in the composition for a resist underlayer film for lithography of the present invention.

The rheology modifier is added primarily for enhancing the fluidity of the composition for forming a resist underlayer film and, particularly in a baking process, for enhancing uniformity in film thickness of the resist underlayer film and enhancing filling of the composition for forming a resist underlayer film into holes. Specific examples thereof can include phthalic acid derivatives such as dimethyl phthalate, diethyl phthalate, diisobutyl phthalate, dihexyl phthalate, and butylisodecyl phthalate, adipic acid derivatives such as di-n-butyl adipate, diisobutyl adipate, diisooctyl adipate, and octyldecyl adipate, maleic acid derivatives such as di-n-butyl maleate, diethyl maleate, and dinonyl maleate, oleic acid derivatives such as methyl oleate, butyl oleate, and tetrahydrofurfuryl oleate, stearic acid derivatives such as n-butyl stearate and glyceryl stearate, and the like. The rheology modifier is usually formulated in a proportion of lower than 30% by mass relative to the total solid contents in the composition for a resist underlayer film for lithography of the present invention.

The adhesive aid is added primarily for enhancing adhesion of the resist underlayer film to the substrate or the resist and, particularly on development, for preventing the resist from peeling. Specific examples thereof can include chlorosilanes such as trimethylchlorosilane, dimethylvinylchlorosilane, methyldiphenylchlorosilane, and chloromethyldimethylchlorosilane, alkoxysilanes such as trimethylmethoxysilane, dimethyldiethoxysilane, methyldimethoxysilane, dimethylvinylethoxysilane, diphenyldimethoxysilane, and phenyltriethoxysilane, silazanes such as hexamethyldisilazane, N,N'-bis(trimethylsilyl)urea, dimethyltrimethylsilylamine, and trimethylsilylimidazole, silanes such as vinyltrichlorosilane, γ-chloropropyltrimethoxysilane, γ-aminopropyltriethoxysilane, and γ-glycidoxypropyltrimethoxysilane, heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine, ureas such as 1,1-dimethylurea and 1,3-dimethylurea, and thiourea compounds. The adhesive aid is usually formulated in a proportion of lower than 5% by mass and preferably lower than 2% by mass relative to the total solid contents in the composition for a resist underlayer film for lithography of the present invention.

The surfactant can be formulated in the composition for a resist underlayer film for lithography of the present invention in order to further enhance the coating properties to prevent surface irregularities and to prevent pinholes, striations, and the like. Examples of the surfactant can include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorine-based surfactants including EFTOP [registered trademark] EF 301, EFTOP EF 303, and EFTOP EF 352 (trade names, manufactured by Mitsubishi Materials Electronic Chemicals Co., Ltd. (formerly Tohkem Products Co., Ltd.)), MEGAFAC [registered trademark] F 171, MEGAFAC F 173, and MEGAFAC R-30 (trade names, manufactured by DIC Corporation (formerly Dainippon Ink and Chemicals, Inc.)), Fluorad FC 430 and Fluorad FC 431 (trade names, manufactured by Sumitomo 3M Limited), and AsahiGuard [registered trademark] AG 710 and Surflon [registered trademark] S-382, SC 101, SC 102, SC 103, SC 104, SC 105, and SC 106 (trade names, manufactured by ASAHI GLASS CO., LTD.), an organosiloxane polymer KP341 (manufactured by Shin-Etsu Chemical Co., Ltd.), and the like. The formulation amount of the surfactant is usually not higher than 2.0% by mass and preferably not higher than 1.0% by mass relative to the total solid contents in the composition for a resist underlayer film for lithography of the present invention. The surfactant may be added alone or can be added as a combination of two or more of these.

In the present invention, as an organic solvent to dissolve the polymer, the crosslinking agent component, the crosslinking catalyst, and the like, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, and the like can be used. The organic solvent is used alone or as a combination of two or more of these.

Furthermore, a solvent with a high boiling point such as propylene glycol monobutyl ether and propylene glycol monobutyl ether acetate can be mixed in the organic solvent. Among the organic solvents above, propylene glycol monomethyl ether, propylene glycol monomethyl ether acetate, ethyl lactate, butyl lactate, cyclohexanone, and the like are preferable to enhance a leveling property.

The resist used in the present invention is a photoresist or an electron beam resist.

As the photoresist to be applied over the resist underlayer film for lithography in the present invention, either of a negative photoresist and a positive photoresist can be used. A positive photoresist composed of a novolac resin and 1,2-naphthoquinone diazide sulfonic acid ester, a chemically amplified photoresist composed of a binder containing a group that decomposes by the action of an acid to cause an increase in an alkali dissolution rate and a photoacid generator, a chemically amplified photoresist composed of an alkali-soluble binder, a low-molecular compound that decomposes by the action of an acid to cause an increase in the alkali dissolution rate of the photoresist, and a photoacid generator, a chemically amplified photoresist composed of a binder containing a group that decomposes by the action of an acid to cause an increase in an alkali dissolution rate, a low-molecular compound that decomposes by the action of an acid to cause an increase in the alkali dissolution rate of the photoresist, and a photoacid generator, a photoresist containing a Si atom in the skeleton, and the like are mentioned, and examples thereof include a product of a trade name APEX-E manufactured by Rohm and Haas Company.

Examples of the electron beam resist to be applied over the resist underlayer film for lithography in the present invention include compositions composed of a resin containing a Si—Si bond in the main chain and a terminal aromatic ring and an acid generator that generates an acid upon electron beam irradiation, compositions composed of poly(p-hydroxystyrene) in which a hydroxy group is substituted with an N-carboxyamine-containing organic group and an acid generator that generates an acid upon electron beam irradiation, and the like. In the case of the latter electron beam resist compositions, the acid generated from the acid generator upon electron beam irradiation reacts with an N-carboxyaminoxy group in a side chain of the polymer, and then the polymer side chain decomposes to produce a hydroxy group that exhibits alkali solubility to allow the compositions to be dissolved in an alkaline developer solution, resulting in resist pattern formation. Examples of the acid generator that generates an acid upon electron beam irradiation include halogenated organic compounds such as 1,1-bis[p-chlorophenyl]-2,2,2-trichloroethane, 1,1-bis[p-methoxyphenyl]-2,2,2- trichloroethane, 1,1-bis[p-chlorophenyl]-2,2-dichloroethane, and 2-chloro-6-(trichloromethyl)pyridine, onium salts such as triphenylsulfonium salts and diphenyliodonium salts, and sulfonic acid esters such as nitrobenzyl tosylate and dinitrobenzyl tosylate.

As a developer solution for a resist having the resist underlayer film formed using the composition for a resist underlayer film for lithography of the present invention, an aqueous solution of an alkali including inorganic alkalis such as sodium hydroxide, potassium hydroxide, sodium carbonate, sodium silicate, sodium metasilicate, and an aqueous ammonia solution, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide, tetraethylammonium hydroxide, and choline, and cyclic amines such as pyrrole and piperidine can be used. The aqueous solution of the alkali that is added with an appropriate amount of an alcohol such as isopropyl alcohol and/or a surfactant such as nonionic surfactants can be used. Among these developer solutions, a quaternary ammonium salt is preferable and tetramethylammonium hydroxide and choline are further preferable.

Next, a process for forming a resist pattern of the present invention will be described. A substrate (a transparent substrate such as a glass substrate or an ITO substrate coated with silicon/silicon dioxide, for example) for production of a precision integrated circuit device is coated with the composition for forming a resist underlayer film by an appropriate coating method using a spinner, a coater, or the like, followed by baking for curing to form a coating-type underlayer film. The film thickness of the resist underlayer film is preferably 0.01 to 3.0 μm. The condition on baking after coating is at 80 to 350° C. for 0.5 to 120 minutes. Subsequently, the resist underlayer film is directly coated with the resist or, where appropriate, is coated with one to several layer(s) of coating material to form a film on the resist underlayer film followed by being coated with the resist. Then, light or electron beam irradiation is performed through a predetermined mask, followed by development, rinsing, and drying. Thus, an excellent resist pattern can be obtained. After light or electron beam irradiation, heating (PEB: Post Exposure Bake) can be performed, where appropriate. Afterwards, the resist underlayer film undergoes dry etching to remove a portion where the resist is developed and removed in the above procedures. Thus, a desired pattern can be formed on the substrate.

The light used on photoresist exposure is an actinic ray including near-ultraviolet light, far-ultraviolet light, or extreme ultraviolet light (EUV, for example), and, for example, light having a wavelength of 248 nm (KrF laser light), 193 nm (ArF laser light), 157 nm ($F_2$ laser light), or the like is used. The method for light irradiation is not particularly limited and any method can be used provided that it can generate an acid from the photoacid generator. The exposure dose is 1 to 2000 mJ/cm$^2$, 10 to 1500 mJ/cm$^2$, or 50 to 1000 mJ/cm$^2$.

Electron beam irradiation for the electron beam resist can be performed using an electron beam irradiator, for example.

Namely, in the present invention, a semiconductor device can be produced by forming the resist underlayer film on the semiconductor substrate using the composition for forming a resist underlayer film, forming the resist film on the resist underlayer film, forming the resist pattern by light or electron beam irradiation and development, etching the resist underlayer film using the resist pattern, and processing the semiconductor substrate using the patterned resist underlayer film.

As a trend toward finer resist patterns progresses, a resolution problem and a problem that resist patterns collapse after development will occur, and thinner-film resists will be desired. Because of this tendency, it becomes difficult to obtain a resist pattern having a film thickness that is adequate for substrate processing, and a demand is growing for a process to provide not only a resist pattern but also a resist underlayer film formed between a resist and a semiconductor substrate being processed with a function to serve as a mask on substrate processing. As the resist underlayer film for such a process, resist underlayer films for lithography having dry etching selectivity similar to that of a resist, resist underlayer films for lithography having dry etching selectivity smaller than that of a resist, and resist underlayer films for lithography having dry etching selectivity smaller than that of a semiconductor substrate are being required instead of conventional resist underlayer films having high etch rate properties. Such resist underlayer films can be provided with an anti-reflection property, which means the resist underlayer films can be provided with a function as a conventional anti-reflective coating.

On the other hand, a process is being introduced to make the pattern widths of a resist pattern and a resist underlayer film on dry etching of the resist underlayer film smaller than the trace widths on resist development in order to obtain a fine resist pattern. As the resist underlayer film for such a process, resist underlayer films having dry etching selectivity similar to that of a resist are being required instead of conventional anti-reflective coatings having high etch rate properties. Such a resist underlayer film can be provided with an anti-reflection property, which means the resist underlayer film can be provided with a function as a conventional anti-reflective coating.

In the present invention, after film formation of the resist underlayer film of the present invention on the substrate, the resist underlayer film can be directly coated with the resist or, where appropriate, can be coated with one to several layer(s) of coating material to form a film on the resist underlayer film followed by being coated with the resist. This renders the pattern widths of the resist pattern smaller and, even in the case of applying the resist thinly for preventing the patterns from collapsing, allows substrate processing via selection of a suitable etching gas.

Namely, a semiconductor device can be produced by forming the resist underlayer film on the semiconductor substrate using the composition for forming a resist underlayer film, forming, on the resist underlayer film, the hard mask composed of a coating material containing a silicon component and the like, forming the resist film on the hard mask, forming the resist pattern by light or electron beam irradiation and development, etching the hard mask using the resist pattern, etching the resist underlayer film using the patterned hard mask, and processing the semiconductor substrate using the patterned resist underlayer film.

Regarding the efficacy as an anti-reflective coating of the composition for forming a resist underlayer film for lithography of the present invention, a light-absorbing moiety is incorporated inside the skeleton and therefore no diffusion of substances occurs into the photoresist upon heating and drying, and the light-absorbing moiety exhibits adequate light-absorption to yield a high anti-reflection effect.

The composition for forming a resist underlayer film for lithography of the present invention has high thermal stability, and therefore contamination of the films formed over the resist underlayer film with a decomposition product resulting from baking is prevented and the temperature range in a baking process can be set with some margin.

Furthermore, the composition for a resist underlayer film for lithography of the present invention can be used as a film that, depending on processing conditions, has an anti-reflection function and further has a function to prevent an interaction between the substrate and the photoresist or to prevent the substrate from being adversely affected by a material in the photoresist or a substance generated upon photoresist exposure.

Example

The weight average molecular weights shown in Synthesis Examples below in the present specification are the results measured by gel permeation chromatography (hereinafter, abbreviated as GPC), A GPC device manufactured by Tosoh Corporation was used in the measurement, and measurement conditions and the like were as follows.

[GPC Condition]

GPC column: Shodex [registered trademark] Asahipak [registered trademark] GF-510HQ (manufactured by Showa Denko K. K.)

Column temperature: 40° C.

Solvent: a solvent in which 10 mmol of LiBr—$H_2O$ was added to DMF (N,N-dimethylformamide)

Flow rate: 0.6 mL/min

Standard sample: a standard polystyrene sample (manufactured by Tosoh Corporation)

Detector: RI (refractometer) (manufactured by Tosoh Corporation)

Synthesis Example 1

40.0 g of a compound of Formula (1-1) (manufactured by DAICEL CHEMICAL INDUSTRIES, LTD., trade name: EHPE3150), 20.3 g of 9-anthracenecarboxylic acid, and 13.7 g of benzoic acid were dissolved in 302.0 g of propylene glycol monomethyl ether, and 1.5 g of benzyltriethylammonium was added thereto, followed by reflux for 24 hours to cause a reaction. After the reaction, the solution was purified by ion exchange to obtain a solution of a polymer of Formula (2-1). GPC analysis of the obtained polymer indicated that the weight average molecular weight in terms of standard polystyrene was 4100.

Synthesis Example 2

40.0 g of a compound of Formula (1-1) (manufactured by DAICEL CHEMICAL INDUSTRIES, LTD., trade name: EHPE3150) and 50.8 g of 9-anthracenecarboxylic acid were dissolved in 308.4 g of propylene glycol monomethyl ether, and 1.3 g of benzyltriethylammonium was added thereto, followed by reflux for 24 hours to cause a reaction. After the reaction, the solution was purified by ion exchange to obtain a solution of a polymer of Formula (3-1). GPC analysis of the obtained polymer indicated that the weight average molecular weight in terms of standard polystyrene was 4500.

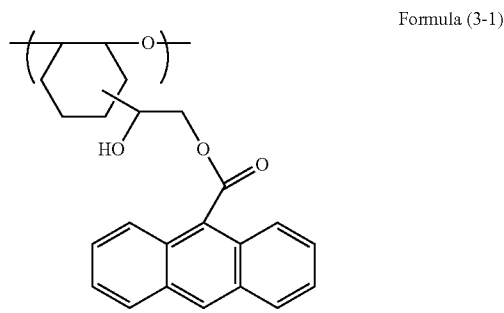

Formula (3-1)

Example 1

To 5 g of the polymer solution obtained in Synthesis Example 1 (polymer solid content: 16% by mass), 0.2 g of tetramethoxymethyl glycoluril, 0.03 g of pyridinium-p-toluenesulfonate, 0.0008 g of MEGAFAC [registered trademark] R-30 (trade name, manufactured by DIC Corporation (formerly Dainippon Ink and Chemicals, Inc.)), 6.4 g of propylene glycol monomethyl ether, and 4.5 g of propylene glycol monomethyl ether acetate were added to be mixed together to obtain a solution. Filtration was then performed using a polyethylene microfilter with a pore size of 0.10 μm, followed by filtration using a polyethylene microfilter with a pore size of 0.05 μm to prepare a solution of a composition for forming a resist underlayer film to be used in a multi-layered film lithography process.

Comparative Example 1

A polymer of Formula (3-2):

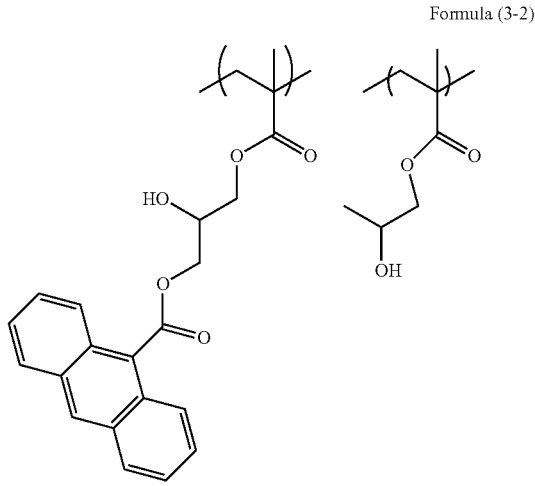

Formula (3-2)

(a copolymer of a reaction product of glycidyl methacrylate and 9-anthracenecarboxylic acid with 2-hydroxypropyl methacrylate in a molar ratio of 35:65), tetramethoxymethyl glycoluril (24% by mass relative to the polymer) as a crosslinking agent, and p-toluenesulfonic acid (2.8% by mass relative to the crosslinking agent) as a crosslinking catalyst were dissolved in propylene glycol monomethyl ether and propylene glycol monomethyl ether acetate (mass ratio: 70:30) as a solvent, followed by adjusting the solid content concentration to be 7% by mass to obtain a solution of a composition for forming a resist underlayer film.

Comparative Example 2

To 5 g of the polymer solution obtained in Synthesis Example 2 (polymer solid content: 16% by mass), 0.2 g of tetramethoxymethyl glycoluril, 0.03 g of pyridinium-p-toluenesulfonate, 0.0008 g of MEGAFAC [registered trademark] R-30 (trade name, manufactured by DIC Corporation (formerly Dainippon Ink and Chemicals, Inc.)), 6.4 g of propylene glycol monomethyl ether, and 4.5 g of propylene glycol monomethyl ether acetate were added to be mixed together to obtain a solution. Filtration was then performed using a polyethylene microfilter with a pore size of 0.10 μm, followed by filtration using a polyethylene microfilter with a pore size of 0.05 μm to prepare a solution of a composition for forming a resist underlayer film to be used in a multi-layered film lithography process.

(Test of Solubility in Solvent)

Each of the polymer solutions obtained in Synthesis Example 1 and Synthesis Example 2 was added to diethyl ether for precipitation, followed by drying under reduced pressure to prepare the polymer of Formula (2-1) and the polymer of Formula (3-1), respectively, as a solid. Each of the polymer of Formula (2-1) and the polymer of Formula (3-1) was dissolved in propylene glycol monomethyl ether, followed by adjusting the concentration of the solution to be 60% by mass. The prepared solution was left at −20° C. for 3 days, followed by visual observation, which indicated that no solid precipitation was confirmed in the solution of the polymer of Formula (2-1), whereas solid precipitation was confirmed in the solution of the polymer of Formula (3-1). This shows that a composition for forming a resist underlayer film prepared using the polymer of Formula (2-1) has high solubility in the solvent and forms no microparticle that is considered to cause the occurrence of contaminants (leading to a defect), resulting from solid precipitation, on an applied film after stored at a low temperature for an extended period of time.

(Optical Parameter Measurement)

A silicon wafer was coated with each of the solutions of a composition for forming a resist underlayer film prepared in Example 1 and Comparative Examples 1 and 2 using a spinner. The workpiece was heated on a hot plate at 215° C. for 1 minute to form a resist underlayer film (film thickness: 0.20 μm). The refractive index (n value) and the optical absorption coefficient (k value, also called an attenuation coefficient) of the resist underlayer film were measured at a wavelength of 248 nm and a wavelength of 193 nm using a spectroscopic ellipsometer (manufactured by J. A. Woollam Company, VUV-VASE VU-302). The results are shown in Table 1.

TABLE 1

Refractive index n and optical absorption coefficient k

| | Refractive index n (wavelength: 248 nm) | Optical absorption coefficient k (wavelength: 248 nm) | Refractive index n (wavelength: 193 nm) | Optical absorption coefficient k (wavelength: 193 nm) |
|---|---|---|---|---|
| Example 1 | 1.51 | 0.39 | 1.66 | 0.26 |
| Comp. Ex. 1 | 1.47 | 0.46 | 1.67 | 0.10 |
| Comp. Ex. 2 | 1.42 | 0.74 | 1.64 | 0.15 |

(Test of Elution into Photoresist Solvent)

A silicon wafer was coated with each of the solutions of a composition for forming a resist underlayer film prepared in Example 1 and Comparative Examples 1 and 2 using a spinner. The workpiece was heated on a hot plate at 205° C. for 1 minute to form a resist underlayer film (film thickness: 0.25 μm). The resist underlayer film was immersed in a solvent to be used for a resist, such as ethyl lactate, propylene glycol monomethyl ether, propylene glycol monomethyl ether acetate, and cyclohexanone, to confirm that the resist underlayer film was insoluble in the solvent.

(Dry Etching Rate Measurement)

A silicon wafer was coated with the solution of a composition for forming a resist underlayer film prepared in Example 1 using a spinner. The workpiece was heated on a hot plate at 205° C. for 1 minute to form a resist underlayer film (film thickness: 0.25 μm). The dry etching rate was measured under a condition using an RIE system ES401 manufactured by Nippon Scientific Co., Ltd. and tetrafluoromethane as a dry etching gas.

In the same manner, the dry etching rates of resist underlayer films formed from compositions for forming a resist underlayer film prepared in Comparative Example 1 and Comparative Example 2 were measured.

The dry etching rate of the resist underlayer film obtained in Example 1 and the dry etching rate of the resist underlayer film obtained in Comparative Example 1 were compared. The dry etching rate of the resist underlayer film obtained in Comparative Example 2 and the dry etching rate of the resist underlayer film obtained in Comparative Example 1 were compared. The results are shown in Table 2.

TABLE 2

Ratio of dry etching rates

| | Ratio of rates |
|---|---|
| Example 1 | 0.8 |
| Comparative Example 1 | 1.0 |
| Comparative Example 2 | 0.7 |

This indicates that, using the composition for a resist underlayer film to be used in a multi-layered film lithography process of the present invention, an excellent coating-type resist underlayer film having dry etching selectivity similar to or smaller than that of a photoresist and having dry etching selectivity smaller than that of a semiconductor substrate, and further having efficacy as an anti-reflective coating can be provided instead of conventional anti-reflective coatings having high etch rate properties.

INDUSTRIAL APPLICABILITY

According to the present invention, a resist underlayer film for lithography having dry etching selectivity similar to that of a resist, a resist underlayer film for lithography having dry etching selectivity smaller than that of a resist, and a resist underlayer film for lithography having dry etching selectivity smaller than that of a semiconductor substrate, either of which causes no intermixing with a resist layer and can provide an excellent resist pattern, can be provided. The composition for forming a resist underlayer film of the present invention can be provided with an ability to effectively absorb light reflected from a substrate in the case where light having a wavelength of 248 nm, 193 nm, 157 nm, or the like is used for irradiation on microfabrication. In addition, according to the present invention, a composition for forming a resist underlayer film that is used for forming a resist underlayer film that further has heat resistance can be provided.

The invention claimed is:

1. A composition for forming a resist underlayer film for lithography, the composition comprising a reaction product (C) of an alicyclic epoxy polymer (A) with a condensed-ring aromatic carboxylic acid and monocyclic aromatic carboxylic acid (B).

2. The composition for forming a resist underlayer film for lithography according to claim 1, wherein the alicyclic epoxy polymer (A) includes a repeating structural unit of Formula (1):

Formula (1)

(T is a repeating unit structure containing an alicyclic ring in the polymer main chain;
and E is an epoxy group or an organic group containing an epoxy group).

3. The composition for forming a resist underlayer film for lithography according to claim 1, wherein the condensed-ring aromatic carboxylic acid and monocyclic aromatic carboxylic acid (B) include a condensed-ring aromatic carboxylic acid (B1) and a monocyclic aromatic carboxylic acid (B2) in a molar ratio of B1:B2=3:7 to 7:3.

4. The composition for forming a resist underlayer film for lithography according to claim 3, wherein the condensed-ring aromatic carboxylic acid (B1) is 9-anthracenecarboxylic acid and the monocyclic aromatic carboxylic acid (B2) is benzoic acid.

5. The composition for forming a resist underlayer film for lithography according to claim 1, wherein the reaction product (C) is a polymer including a repeating structural unit of Formula (2):

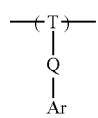

Formula (2)

(T is a repeating unit structure containing an alicyclic ring in the polymer main chain; Q is an organic group linking T and Ar; and Ar is an aromatic condensed ring or an aromatic monocyclic ring).

6. The composition for forming a resist underlayer film for lithography according to claim 1, wherein the reaction product (C) is a polymer in which the number of a repeating structural unit a of Formula (3), the number of a repeating structural unit b of Formula (4), and the number of a repeating structural unit c of Formula (5):

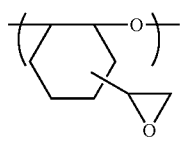

Formula (3)

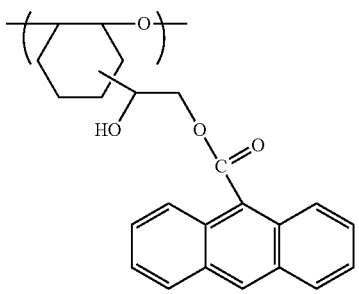

Formula (4)

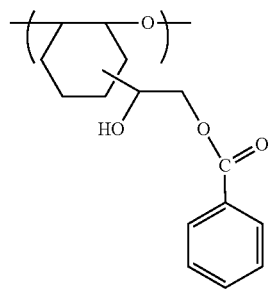

Formula (5)

satisfy $0 \leq a \leq 0.2$, $0.3 \leq b \leq 0.7$, $0.3 \leq c \leq 0.7$, and $0.5 \leq b+c \leq 1.0$ provided that the total number of the repeating structural units in the reaction product (C) is 1.0.

7. The composition for forming a resist underlayer film for lithography according to claim 6, wherein the reaction product (C) is a polymer in which the number of the repeating structural unit a of Formula (3), the number of the repeating structural unit b of Formula (4), and the number of the repeating structural unit c of Formula (5) satisfy the conditions that a is 0, b is 0.45, and c is 0.55 provided that the total number of the repeating structural units in the reaction product (C) is 1.0.

8. The composition for forming a resist underlayer film for lithography according to claim 1, further comprising a crosslinking agent.

9. The composition for forming a resist underlayer film for lithography according to claim 1, further comprising an acid or an acid generator.

10. A resist underlayer film for lithography obtained by coating a semiconductor substrate with the composition for forming a resist underlayer film for lithography as claimed in claim 1 and baking the resultant product.

11. A process for forming a resist pattern used for semiconductor production, the process comprising coating a semiconductor substrate with the composition for forming a resist underlayer film for lithography as claimed in claim 1 and baking the resultant product to form a resist underlayer film for lithography.

12. A process for producing a semiconductor device, the process comprising:
    forming a resist underlayer film for lithography using the composition for forming a resist underlayer film for lithography as claimed in claim 1 on a semiconductor substrate;
    forming a resist film on the resist underlayer film;
    forming a resist pattern by light or electron beam irradiation and development;
    etching the resist underlayer film for lithography using the resist pattern; and
    processing the semiconductor substrate using the patterned resist underlayer film for lithography.

13. A process for producing a semiconductor device, the process comprising:
- forming a resist underlayer film for lithography using the composition for forming a resist underlayer film for lithography as claimed in claim 1 on a semiconductor substrate;
- forming a hard mask on the resist underlayer film;
- forming a resist film on the hard mask;
- forming a resist pattern by light or electron beam irradiation and development;
- etching the hard mask using the resist pattern;
- etching the resist underlayer film for lithography using the patterned hard mask; and
- processing the semiconductor substrate using the patterned resist underlayer film for lithography.

* * * * *